(12) United States Patent
Kauffmann et al.

(10) Patent No.: US 6,816,401 B2
(45) Date of Patent: Nov. 9, 2004

(54) STATIC RANDOM ACCESS MEMORY (SRAM) WITHOUT PRECHARGE CIRCUITRY

(75) Inventors: Brian R. Kauffmann, Pocatello, ID (US); Charles A. Edmondson, Pocatello, ID (US); James R. Brown, Idaho Falls, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 18 days.

(21) Appl. No.: 10/406,526

(22) Filed: Apr. 3, 2003

(65) Prior Publication Data

US 2004/0196686 A1 Oct. 7, 2004

(51) Int. Cl.[7] .............................................. G11C 11/00
(52) U.S. Cl. ................... 365/154; 365/156; 365/230.06
(58) Field of Search .............................. 365/154, 156, 365/230.06

(56) References Cited

U.S. PATENT DOCUMENTS 5,239,237 A * 8/1993 Tran et al. ............. 365/189.05
5,341,041 A * 8/1994 El Gamal ................... 326/44
6,452,851 B1 * 9/2002 Endo et al. ................ 365/154

OTHER PUBLICATIONS

U.S. patent application entitled "Distributed Memory And Logic Circuits", given Ser. No. 10/422,137, filed on Apr. 24, 2003 (Our docket No. M–15082 US).

* cited by examiner

Primary Examiner—Huan Hoang
(74) Attorney, Agent, or Firm—MacPherson Kwok Chen & Heid LLP

(57) ABSTRACT

An SRAM memory includes a pull-up device coupled to each row of word lines in an array of SRAM cells. The pull-up devices are sized such that when a row is selected, the time for the associated word line to fully charge is sufficiently slow such that data stored in the selected SRAM cells are not corrupted during a read operation. By slowly charging the word lines, the corresponding access transistors are also slowly turned on, resulting in the coupled bit lines slowly charging or discharging from the data stored in the SRAM cell. Because there is not a sudden large charge transfer between the stored data and the coupled bit line, the data will not be corrupted during a read operation, and read precharge circuitry is not required.

18 Claims, 3 Drawing Sheets

STATIC RANDOM ACCESS MEMORY (SRAM) WITHOUT PRECHARGE CIRCUITRY

BACKGROUND

1. Field of Invention

The present invention relates to semiconductor memories, and in particular, to static random access memories (SRAMs).

2. Related Art

In general, a static random access memory (SRAM) cell includes a bistable flipflop, where the flipflop is formed from two cross-coupled transistors that store the data and two load elements. The cross-coupled or storage transistors are typically NMOS transistors, while the load elements may be enhancement or depletion mode transistors, PMOS transistors, or load resistors in different configurations. An access or select transistor is coupled between each storage transistor and load element to access the corresponding storage transistor for reading (accessing the data stored) from or writing (storing data) to the transistor. The load elements offset any charge leakage at the drains of the storage transistors that may corrupt the data. Since the memory cell is static, e.g., the cell has an internal feedback to maintain a stable output voltage, the data remains stored in latches without having to periodically refresh the memory as long as power is maintained to the memory cell.

An array of such SRAM cells may be configured in rows and columns to form a memory array, e.g. a 16K RAM. FIG. 1 shows a portion of a typical SRAM memory array with an SRAM cell 100. SRAM cell 100 includes two NMOS transistors 102 and 104 and two PMOS transistors 106 and 108, each NMOS/PMOS pair coupled together to form an inverter. The gates of NMOS transistor 102 and PMOS transistor 106 are connected to each other as are the drains. NMOS transistor 104 and PMOS transistor 108 are similarly connected. Further, the commonly connected drains of transistors 102 and 106 (or the output of the inverter) are coupled to the gates of transistors 104 and 108, while the commonly connected drains of transistors 104 and 108 are coupled to the gates of transistors 102 and 106, i.e., cross-coupled. The sources of NMOS transistors 102 and 104 are coupled to a first reference voltage Vss or ground, and the sources of PMOS transistors 106 and 108 are coupled. to a second reference voltage Vdd or supply voltage.

An access or select transistor 110 is coupled between the drains of transistors 102 and 106 and a bit line 114. A second access or select transistor 112 is coupled between the drains of transistors 104 and 108 and a second bit line or $\overline{\text{bit}}$ line 116, which is the complement of bit line 114. In an SRAM array, there are multiple word lines and bit line pairs (the true and complement) arranged in the row and column directions, respectively. Thus, each SRAM cell has a corresponding word line and two bit lines (bit and $\overline{\text{bit}}$). In some configurations, the bit lines may be connected to data lines for writing to or reading from the SRAM cells. As is known in the art, address decoder circuits (e.g., row and column decoders) select the SRAM cell to be written to or read from by turning on the appropriate select or access transistor, and control signals determine whether the operation will be a read or write for the selected memory cell. Depending on the configuration, an SRAM cell may have two, four (two for each port), or more access transistors.

Typically, for maximum circuit density, the size of the inverters formed from transistors 102/106 and 104/108 are minimized and are thus unable to provide sufficient power to bring the respective bit line 114 and $\overline{\text{bit}}$ line 116 to a true logic-zero or logic-one state as quickly as desired. That is, they are insufficiently sized to sink or source the charge on the lines so that one of the lines is brought quickly to a ground potential Vss, and one of the lines is brought quickly to the power supply potential Vdd, respectively. Thus, a differential detector or sense amplifier (not shown) is typically provided to sense a difference between the voltages on bit line 114 and $\overline{\text{bit}}$ line 116, and produces the appropriate logic output value corresponding to the state of the memory cell.

To properly and quickly detect the voltage differential at bit line 114 and $\overline{\text{bit}}$ line 116, bit line 114 and $\overline{\text{bit}}$ line 116 are "precharged" to a known voltage before the selected memory cell is connected to the bit lines. The known voltage is typically selected to be a voltage that is neither sufficiently high nor sufficiently low to cause either of the two inverters (transistors 102/106 or transistors 104/108) in the memory cell to change state. Precharge circuits are well known, some typically precharging the bit lines to a voltage level that is approximately equal to half the supply voltage Vdd, i.e., vdd/2. Precharge circuits are coupled to the bit lines and have control signals that determine when the bit lines are to be charged.

In typical operation, the voltage output of the precharge circuit is placed on both bit line 114 and $\overline{\text{bit}}$ line 116 and charges the lines to the nominal voltage level of Vdd/2 before a read operation, in one example. In some precharge circuits, a pass transistor couples the supply voltage to the bit lines. Once the pass transistor is turned on, the connected bit line will charge to a level lower than the supply voltage because the pass transistor only remains on when the potential difference between the gate and source (or drain) of the pass transistor is at least as great as the threshold voltage. Thus, the bit line charges to a level that is a threshold voltage below the supply voltage. Typically, both bit lines are precharged to the same level, e.g., by connecting the two by another pass transistor.

Having precharged each bit line to the same voltage level, the particular memory cell can be selected for a "read" of the value contained within the memory cell. Because the SRAM cell contains opposing inverters, the voltage level on one of the bit lines 114 or 116 increases, while the voltage at the other of the bit lines decreases, depending upon the logic value stored in the cell, as determined by the state of the cross-coupled inverters. This difference in voltage levels on the bit line 114 and $\overline{\text{bit}}$ line 116 is detected by the differential detector (not shown), and an appropriate logic "0" or logic "1" value is produced by the differential detector, corresponding to the logic state of the selected memory cell. Thus, the use of a differential detector allows the data to be detected on the bit lines without the bit lines being charged to full logic 0 or 1 levels.

Precharging the bitlines also increases the speed of read or write operations since data that was previously read or written may remain on the bit lines. In addition to slowing down the subsequent read or write, the pre-existing data may corrupt the new data. Thus, precharging to a level between the supply voltage and ground may also prevent errors in reading or writing to the memory cell.

However, precharge circuitry adds both complexity and size to the memory. Incorporating precharge circuitry utilizes critical area that can be used for other purposes and adds complexity to the design.

Accordingly, it is desirable to have an SRAM memory that does not require precharge circuitry so that the physical size and/or the complexity of the memory can be minimized or valuable area can be used for other purposes.

SUMMARY

In accordance with one aspect of the present invention, a pull-up device drives word lines in a static random access memory (SRAM) during a read operation. The pull-up devices control the rise time to charge the word lines to their full voltage levels during the read operation. By slowly charging the word lines, data stored in the SRAM memory cells are not corrupted or destroyed by changing states as the bitline charge is coupled too quickly to the SRAM cell. The present invention eliminates the need for separate precharge circuitry, which reduces the complexity and size of the SRAM memory.

In one embodiment, the memory includes an SRAM cell formed from two cross-coupled inverters, where each inverter comprises a PMOS transistor and an NMOS transistor sharing a common drain and a common gate. The PMOS transistor is coupled to a supply voltage, while the NMOS transistor is coupled to a ground potential. The output of the first inverter is coupled to the input of the second inverter, and the output of the second inverter is coupled to the input of the first inverter. A select or access transistor is coupled between an input or output of each inverter and a bit line. A row driver, which is an inverter comprised of a PMOS transistor and an NMOS transistor sharing a common drain and a common gate in one embodiment, is coupled to the gate of each access transistor along a row or word line.

By appropriately sizing the row drivers, the time that it takes to fully charge a word line and completely turn on a desired row of access transistors can be controlled. If the word line is charged too quickly during a read operation, the charge on the bit lines associated with the selected SRAM cells may "flip" the data stored in the cells. Thus, during a read, a desired word line can be slowly charged such that the corresponding access transistors are slowly turned on, which limits the current through the access transistors, and the bit lines slowly charged (or discharged), thereby allowing data to be read from the selected memory cell without the data being corrupted or destroyed.

In one embodiment, the minimum rise time is first determined based on the circuit characteristics, such as by a computer-based circuit simulation, e.g., SPICE. This minimum rise time is the shortest allowable time that the word line can be charged and still prevent data from being corrupted or flipped. Once the minimum rise time is determined, the row drivers are sized appropriately, such as by adjusting their width, so that the rise time of the word line is controlled.

Thus, the present invention allows the construction of a SRAM memory without read precharge circuitry, resulting in saving area and simplifying the design.

The present invention will be more fully understood when taken in light of the following detailed description taken together with the accompanying drawings.

BRIEF DESCRIPTION OF THE DRAWINGS

Use of the same or similar reference numbers in different figures indicates same or like elements.

DETAILED DESCRIPTION OF THE PREFERRED EMBODIMENTS

In accordance with one aspect of the present invention, an inverter is coupled to an associated word line in a static random access memory (SRAM) to drive the word line. The inverter controls the rise time for charging the associated word line or output of the inverter, which allows an SRAM cell to be read without the need of precharge circuitry. Further, by ensuring that the word lines do not charge too quickly, data in the SRAM cell can be read without corrupting the data.

Figure 1:
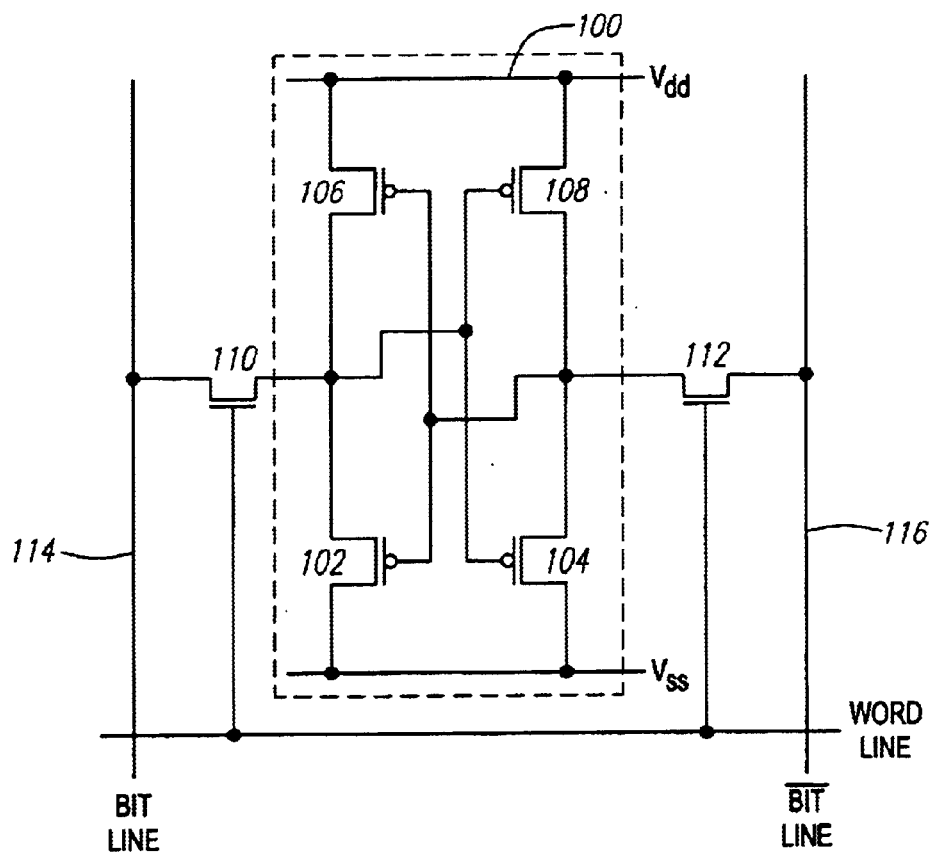
FIG. 1 is a circuit diagram of a portion of a conventional SRAM memory and memory cell.
Figure 2:
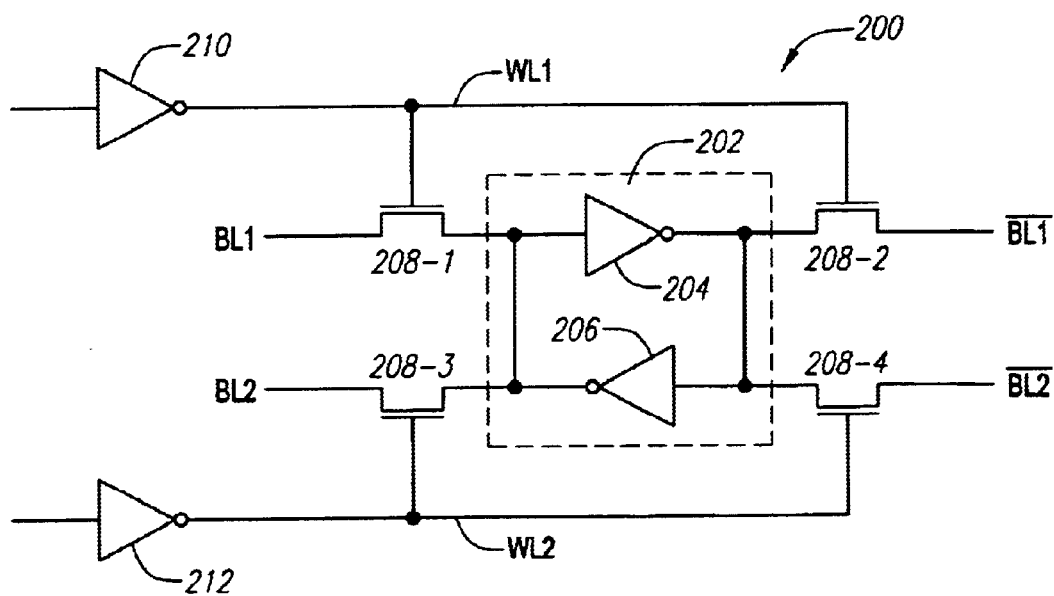
FIG. 2 is a circuit diagram of a portion of an SRAM memory, according to one embodiment of the invention.

FIG. 2 is a circuit diagram showing a portion of an SRAM memory 200 according to one embodiment of the present invention. SRAM memory 200 includes a conventional SRAM cell 202 formed from two cross-coupled inverters 204 and 206. The output of inverter 204 is coupled to the input of inverter 206, while the output of inverter 206 is coupled to the input of inverter 204. Therefore, if inverter 204 has an output data logic "1", then inverter 206 will have a complementary output data logic "0", and vice versa. A plurality of SRAM cells 202 may be arranged in rows and columns to form a SRAM memory array.

Figure 3:
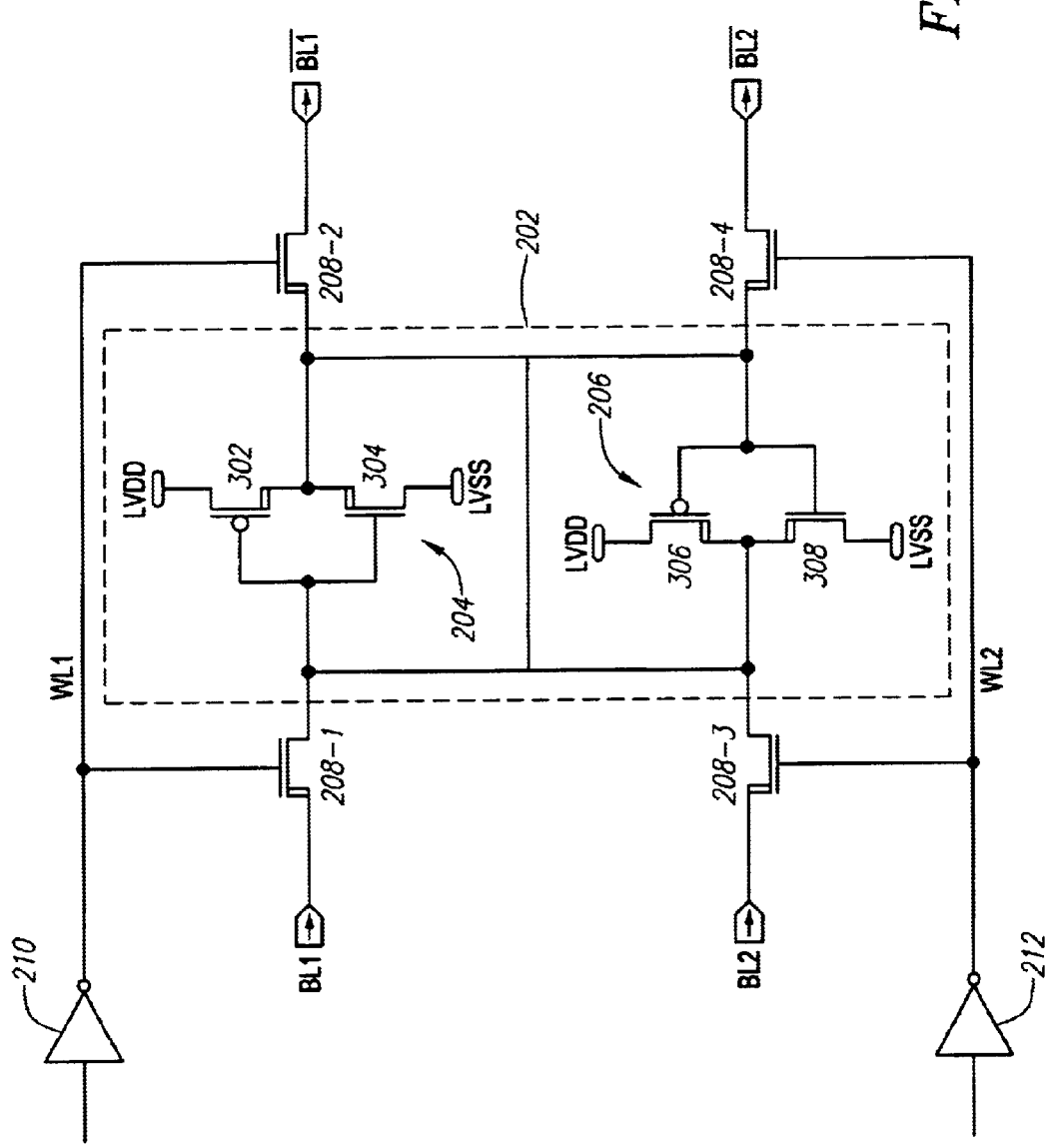
FIG. 3 is a circuit diagram of a static random access memory (SRAM) cell for the circuit of FIG. 2, according to one embodiment.

FIG. 3 shows SRAM cell 202, where inverters 204 and 206 of FIG. 2 are formed by PMOS and NMOS transistors according to one embodiment. FIG. 3 also shows access transistors 208-1 to 208-4, as will be discussed below with respect to FIG. 2. Inverter 204 includes a PMOS transistor 302 coupled to an NMOS transistor 304. The gates of PMOS transistor 302 and NMOS transistor 304 are commonly connected and act as the input of the inverter. The drains of PMOS transistor 302 and NMOS transistor 304 are also commonly connected and act as the output of the inverter. The source of PMOS transistor 302 is coupled to a first voltage source, e.g., supply voltage Vdd, while the source of NMOS transistor 304 is coupled to a second voltage source, e.g., ground potential Vss. When the input to the inverter is high, PMOS transistor 302 is turned off to isolate voltage Vdd, while NMOS transistor 304 is turned on, which pulls the output of the inverter low through connection to ground Vss. On the other hand, when the input to the inverter is low, NMOS transistor 304 is off, which isolates ground Vss, while PMOS transistor 302 is on and conducts current to pull up the output of the inverter high. Inverter 206 is formed similarly with PMOS transistor 306 and NMOS transistor 308, where the output and the input of inverter 206 is the common drain and common gate, respectively, of the PMOS/NMOS transistor pair. Note that the size of the transistors forming the inverters can be any size to completely pull to Vdd or Vss levels, provided that the loading is only capacitive, i.e., no DC current draw.

Referring back to FIG. 2, a first bit line BL1 accesses a selected SRAM cell 202 by an access or select transistor 208-1 coupled between bit line BL1 and the cross-coupled inverters 204 and 206. The complement $\overline{BL1}$ of first bit line BL1 accesses SRAM cell 202 by a second access transistor 208-2 coupled between bit line $\overline{BL1}$ and the SRAM cell. Similarly, a second bit line BL2 and its complement $\overline{BL2}$ may access SRAM cell 202 via third and fourth access transistors 208-3 and 208-4, respectively. Access transistors 208, in one embodiment, are NMOS transistors. Data stored in SRAM cell 202 can thus be read to bit lines BL1, $\overline{BL1}$, BL2, or $\overline{BL2}$ by turning on access transistors 208-1, 208-2, 208-3, or 208-4, respectively. A first word line WL1 is coupled to the gate of access transistors 208-1 and 208-2, and a second word line WL2 is coupled to the gate of access transistors 208-3 and 208-4.

A plurality of SRAM cells 202 may be arranged in rows and columns to form an SRAM memory array. Selected SRAM cells are addressed by applying control signals to appropriate word lines. For example, SRAM cell 202 may be selected by asserting word line WL1 which applies a high voltage to access transistors 208-1 and 208-2. This turns on access transistors 208-1 and 208-2, thereby connecting bit lines BL1 and $\overline{BL1}$ to SRAM cell 202. However, in order for the access transistors to remain on, the potential difference between the gate and source (or drain) must be greater than or equal to the threshold voltage of the transistor. The data from inverter 206 is then transferred or read onto bit line BL1, and the complementary data from inverter 204 is transferred onto complementary bit line $\overline{BL1}$. If word line WL2 is asserted, access transistors 208-3 and 208-4 are turned on, and the data from inverter 208 is transferred onto bit line BL2, and the complementary data from inverter 204 is transferred onto complementary bit line $\overline{BL2}$.

A row driver 210 is coupled to word line WL1 to drive word line WL1 to a level sufficient to turn on access transistors 208-1 and 208-2, while a row driver 212 is coupled to word line WL2 to drive word line WL2 to voltage levels sufficient to turn on access transistors 208-3 and 208-4. Each row driver 210 or 212 drives one word line in the memory array. Thus, if the memory has sixteen rows or word lines, sixteen of such row drivers 210 and 212 may select the desired row, based on control signals, as is known in the art. In one embodiment, row drivers 210 and 212 are pull-up devices, such as an inverter, an example of which is shown in FIG. 3 (e.g., PMOS/NMOS transistor pair 302 and 304). Row drivers 210 and 212 are sized to control the rise time needed to turn on and maintain the desired voltage of access transistors 208. If word line WL2 is selected and quickly charges to a level sufficient to turn on access transistors 208-3 and 208-4, the data stored in SRAM cell 202 may be corrupted or destroyed.

For example, assume a logic "0" is stored in SRAM cell 202 (FIG. 3). Also, assume BL2=1 and $\overline{BL2}$=0. Right before a read operation, NMOS transistor 304 and PMOS transistor 306 are off, while the PMOS transistor 302 and NMOS transistor 308 operate in the linear mode. Thus, voltages at the common drains of inverter 206 and inverter 204 before the access transistors are turned on are 0 V and Vdd, respectively, corresponding to a logic "0" and logic "1". At the start of the read operation, word line WL2 is asserted to turn on access transistors 208-3 and 208-4. The voltage level of bit lines BL1 and $\overline{BL1}$ will not show any significant variation since no current will flow through access transistors 208-1 and 208-2. However, access transistor 208-3 and NMOS transistor 308 will conduct a non-zero current and the voltage level of bit line BL2 will begin to drop slightly. While access transistor 208-3 and NMOS transistor 308 are discharging bit line BL2 (assuming a full logic level "1"), the voltage at the output of inverter 206 will increase from its initial value of 0 V. Similarly, access transistor 208-4 will conduct current, pulling up bit line $\overline{BL2}$ and then decreasing the output of inverter 204.

However, if access transistor 208-3 is turned on too quickly, the voltage at the output of inverter 206 may exceed the threshold voltage of NMOS transistor 304 (of inverter 204). If this occurs, then NMOS transistor 304 will turn on and pull down the voltage at the output of inverter 204 low. As a result, the stored data is "flipped", and the read-out data is corrupted. Thus, if word line WL2 is asserted, and bit lines BL2 and $\overline{BL2}$ are at full logic levels, e.g., after a write operation, data stored in the SRAM cell may be corrupted or destroyed if the word lines are activated too quickly. So, by limiting the rise time of the word lines, which limits the current through access transistors 208, the stored bit is not flipped during a read operation when large voltage differences exist between the stored data and the coupled bit line at the start of the read.

The above description applies to a single port RAM cell or a multi-port RAM cell with only a single word line rising at a time. However, for the two port RAM cell of FIGS. 2 and 3, the worst case for determining the allowable rise rate, or minimum rise time, for the word lines, is when WL1 and WL2 are both rising at exactly the same time, along with BL1=BL2 and $\overline{BL1}$=$\overline{BL2}$ being in the opposite state of the stored data at the beginning of the read operation. In this situation, there will be current through both transistors 208-1 and 208-3, tending to pull up the output of inverter 206; and current through both transistors 208-2 and 208-4, tending to pull down the output of inverter 204.

For both WL1 and WL2 rising together, the minimum rise time, to keep from flipping the bit, is about twice what it would be for only WL1 or only WL2 rising, with the other line held low. For a triple port RAM cell, with three word lines and three pairs of access transistors, the required minimum rise time for all three lines rising together would be about three times that of a single word line rising. Thus, those skilled in the art will recognize that the charge transfer will scale with the number of active ports.

Therefore, according to one aspect of the present invention, the rise time for charging the word lines is controlled to prevent flipping of the stored data or bits. A minimum rise time for charging the word lines is such that the stored data or bits are not flipped under specified process, voltage, and/or temperature conditions for the design. The rise time is set to a minimum so that higher rise times, which will charge the word lines slower, will also not cause the data to be flipped. Flipping is a function of the bit line capacitance, the size of access transistors 208, and the drive capability of inverters 204 and 206. Analysis, such as with circuit programs like SPICE, allows designers to determine the minimum rise time to prevent flipping for a particular design and to then select the size of the word line drivers to achieve this rise time.

The rise time is approximately inversely proportional to the width of the row line pull up device, row drivers 210 and 212 in this embodiment. The size of the NMOS and PMOS transistors forming row drivers 210 and 212 affect how fast the word lines are charged. For example, if the input signal to row driver 210 is low, the pull-up transistor (i.e., the PMOS transistor coupled to supply voltage Vdd) will pull the output of row driver 210 high, with the time to reach a full logic high level being dependent upon the size of the transistor. The rise time is controlled by the resistance and capacitance product (R*C) of the driver and word line circuitry.

The resistance is determined by the sum of the resistance of the word line plus the resistance of the driver. If the word line is metal, its resistance can be very small and may be practically ignored. If the word line is poly-silicon or diffusion, the resistance will be significant. The driver resistance is approximately proportional to the length of the driver, and inversely proportional to the width of the driver (for a standard MOS device, while other devices, e.g., JFET or BJT, may have resistance specified differently as a function of device size). Thus, depending on the resistance of the word line, the desired resistance of the driver or inverter can be controlled by appropriately sizing the driver to reach the desired total resistance.

The capacitance is determined by the word line capacitance to the surrounding circuitry, and by the capacitance of the access transistors connected to the word line.

The minimum rise time may be determined using circuit analysis techniques or computer circuit simulation using a SPICE tool. The circuit analyzed includes the row line driver, a model of the row line interconnect including loading of all the storage cells on the row line, the circuit storage cell, a model of the bit line including the loading of all the storage cells on the bit line, and the read/write cell connected to the bit line.

This circuit is analyzed at various combinations, which can include the following variables: manufacturing process, voltage, and temperature. For each combination of variables, it is determined if the stored data is corrupted or flipped as the row line voltage rises. If the data is corrupted, the width of the row driver device (inverters 210 and 212 in this embodiment) is decreased and the circuit analyzed again. An acceptable design is one that does not corrupt the stored data under any combination of the process, voltage, and temperature variables. Depending on the designer, other variables may also be included or removed in determining the appropriate rise time and driver size.

Thus, by selecting the appropriate transistors forming row drivers 210 and 212, the time it takes the output of row driver 210 and 212 to reach a full logic high level can be controlled such that access transistors 208 are slowly turned on. As a result, the bit lines are slowly charged or discharged to their final value, depending on the state of the SRAM memory cell (i.e., the stored data). This prevents the data in the SRAM cell from being corrupted due to a large voltage imbalance between the bit line and the corresponding output from the latch during a read operation.

Consequently, the present invention allows an SRAM memory to be read without the need for precharge circuitry that may add both complexity and size to the memory.

Figure 4:
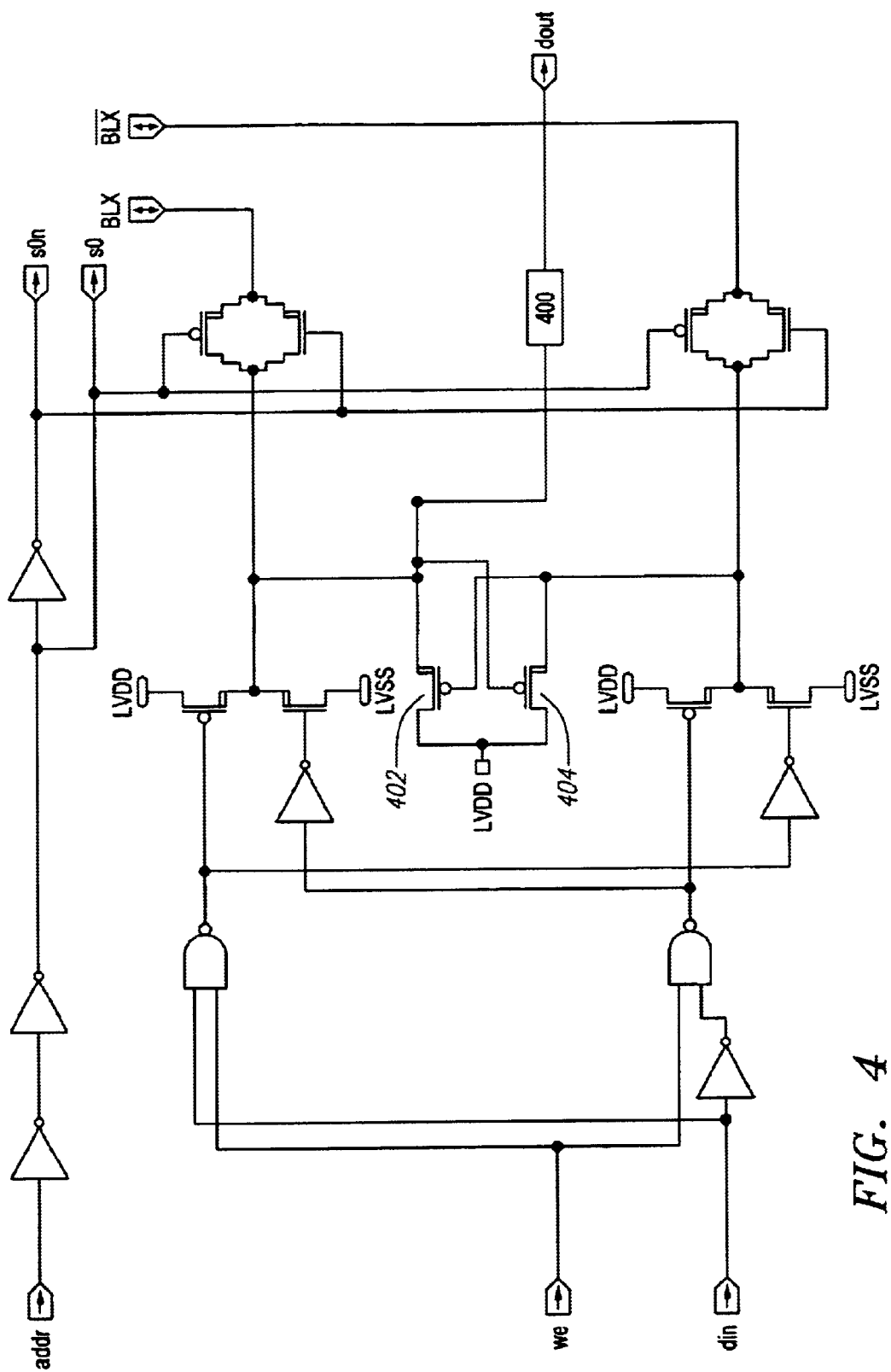
FIG. 4 is a circuit diagram of a portion of a circuit to read from and write to a SRAM cell, according to one embodiment of the invention.

FIG. 4 shows a portion of a circuit to read from and write to an SRAM cell, such as the SRAM cell shown in FIG. 3. A write enable signal, we, is asserted high during a write operation. A data signal, din, determines whether a logic "1" or "0" is to be written to the SRAM cell, and an address signal, addr, which selects the bit lines to connect to the circuit. A sense amplifier 400 receives data from the cross-coupled PMOS devices 402 and 404 and level-shifts and buffers the data sent to the output dout. The bit lines BLx and $\overline{BLx}$ can be coupled to bit lines BL1 and $\overline{BL1}$ (or BL2 and $\overline{BL2}$) of FIG. 3, respectively, to access the SRAM cell for read/write operations.

The above-described embodiments of the present invention are merely meant to be illustrative and not limiting. For example, NMOS transistors are described for use as the access transistors. However, PMOS transistors may also be used. In this case, the SRAM cell would be accessed by driving the word lines low, rather than high, and the fall time, rather than the rise time, would be the parameter to be controlled. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A static random access memory (SRAM), comprising:
   an SRAM cell comprising first and second cross-coupled inverters;
   a first access transistor coupled between the input of the first inverter and a first bit line;
   a second access transistor coupled between the output of the first inverter and a first complement bit line;
   a word line coupled to the gates of the first and second access transistors; and
   a row driver coupled to the word line, wherein the size of the row driver is adjusted to control the rise time of the word line.

2. The memory of claim 1, further comprising:
   a third access transistor coupled between the output of the second inverter and a second bit line;
   a fourth access transistor coupled between the input of the second inverter and a second complement bit line;
   a second word line coupled to the gates of the third and fourth access transistors; and
   a second row driver coupled to the second word line.

3. The memory of claim 1, wherein the row driver is a pull-up device.

4. The memory of claim 1, wherein the row driver is an inverter.

5. The memory of claim 1, wherein the row driver comprises a PMOS transistor and an NMOS transistor.

6. The memory of claim 1, wherein the first and second cross-coupled inverters each comprise a PMOS transistor and an NMOS transistor.

7. The memory of claim 1, wherein the row driver drives the word line.

8. The memory of claim 1, wherein the first and second access transistors are NMOS transistors.

9. The memory of claim 1, wherein the row driver is connected directly to the word line.

10. The memory of claim 1, where the width of the row driver is adjusted to control the rise time of the word line.

11. The memory of claim 1, further comprising a read/write circuit coupled to the first bit line and the first complement bit line.

12. The memory of claim 1, wherein the row driver is coupled directly to the word line.

13. A method of operating a static random access memory (SRAM), the SRAM comprising an SRAM cell, a first access transistor coupled between the SRAM cell and a first bit line, a second access transistor coupled between the SRAM cell and a second bit line, wherein the second bit line is the complement of the first bit line, and a word line coupled to the gates of the first and second access transistors, the method comprising:
   storing data in the SRAM cell;
   controlling the rise time to charge the word line to turn on the access transistors during a read operation and prevent corrupting the data, wherein the controlling is by adjusting the size of the row driver pull up device; and
   transferring the data from the SRAM cell onto the first bit line.

14. The method of claim 13, wherein charging the word line is by a row driver pull up device.

15. The method of claim 14, wherein the row driver pull up device is an inverter.

16. The method of claim 14, further comprising coupling the row line driver directly to the word line.

17. The method of claim 13, further comprising determining a minimum rise time to prevent the data from being corrupted.

18. The method of claim 13, further comprising transferring the data from the SRAM cell onto the second bit line.

* * * * *